(12) United States Patent
Katz et al.

(10) Patent No.: US 8,102,940 B1
(45) Date of Patent: Jan. 24, 2012

(54) RECEIVE FREQUENCY BAND INTERFERENCE PROTECTION SYSTEM USING PREDISTORTION LINEARIZATION

(75) Inventors: Allen Katz, West Windsor, NJ (US); Donald P. Farrell, Raleigh, NC (US); James L. Martinetti, Colonia, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 1194 days.

(21) Appl. No.: 11/826,494

(22) Filed: Jul. 16, 2007

(51) Int. Cl.
*H04K 1/02* (2006.01)

(52) U.S. Cl. ........ 375/296; 375/295; 375/297; 375/299; 375/302; 375/306; 330/149; 330/151

(58) Field of Classification Search .................. 375/242, 375/295, 296, 297, 299, 302, 316, 354, 342, 375/345
See application file for complete search history.

(56) References Cited

U.S. PATENT DOCUMENTS

| | | | |
|---|---|---|---|
| 6,211,734 B1 * | 4/2001 | Ahn | 330/149 |
| 6,393,011 B1 * | 5/2002 | Kim | 370/342 |
| 7,778,354 B2 * | 8/2010 | Yamaguchi et al. | 375/298 |
| 8,014,443 B2 * | 9/2011 | Nakamura et al. | 375/232 |
| 2002/0177424 A1 * | 11/2002 | Matsuyoshi et al. | 455/295 |
| 2003/0117216 A1 * | 6/2003 | Villemazet et al. | 330/149 |
| 2005/0168283 A1 * | 8/2005 | Suzuki et al. | 330/149 |
| 2006/0276147 A1 * | 12/2006 | Suzuki et al. | 455/114.3 |
| 2008/0030269 A1 * | 2/2008 | Tsuda et al. | 330/149 |

* cited by examiner

*Primary Examiner* — Shuwang Liu
*Assistant Examiner* — Hirdepal Singh
(74) *Attorney, Agent, or Firm* — McDermott Will & Emery LLP

(57) ABSTRACT

A receive frequency band interference protection system includes an input terminal for receiving an input signal and a dividing coupler coupled to the input terminal. The dividing coupler is configured to divide the input signal into a first signal and a second signal. The system further includes a first signal path and a second signal path. The first signal path includes a delay, and it is coupled to the dividing coupler and configured to receive the first signal. The second signal path is coupled to the dividing coupler and configured to receive the second signal. The second signal path includes an attenuator coupled to the dividing coupler and a predistortion linearizer coupled to the attenuator. The system further includes a combining coupler and an output terminal. The combining coupler is coupled to the first signal path and the second signal path. The combining coupler is configured to obtain a sum of the respective outputs of the first signal path and the second signal path. The output terminal is coupled to the combining coupler and configured to send out the sum.

17 Claims, 4 Drawing Sheets

RECEIVE FREQUENCY BAND INTERFERENCE PROTECTION SYSTEM USING PREDISTORTION LINEARIZATION

STATEMENT AS TO RIGHTS TO INVENTIONS MADE UNDER FEDERALLY SPONSORED RESEARCH OR DEVELOPMENT

The U.S. Government has a paid-up license in the invention and the right in limited circumstances to require the patent owner to license others under reasonable terms as provided for by the terms of Contract Nos. N00039-04-C-2009 awarded by the U.S. Navy.

FIELD OF THE INVENTION

The present invention generally relates to a system and method for reducing interference in a receive frequency band or bands, and, in particular, relates to a system and method for reducing interference in a receive frequency band or bands caused by a transmit power amplifier operating in an adjacent frequency band.

BACKGROUND OF THE INVENTION

Transmit power amplifiers can generate interference in various frequency bands, both proximal and distant to the signal frequency.

Interference in the receive frequency band generated by a transmit power amplifier is commonly reduced by means of filtering. Usually a combination of band-pass and band-stop filters are used to reject interference in the receive frequency band or bands. Depending on the frequency separation between the receive and transmit frequency bands, the filters required for adequate interference rejection can be large in size and weight, and of high cost. They also introduce signal power loss after the transmit power amplifier. In some applications, because of the small separation of receive and transmit frequency bands, a filter approach is impractical.

Feed-forward linearization has been used to correct receive frequency band interference. However, feed-forward system solutions tend to be quite complex and also introduce loss after the transmit power amplifier.

SUMMARY OF THE INVENTION

The present invention provides a system which reduces interference in a receive frequency band or bands. According to one aspect of the present invention, the interference protection systems disclosed herein introduce little to no loss after the transmit power amplifier. Furthermore, the interference protection systems are significantly less complex than feed-forward techniques and still offer a moderate level of interference rejection in the receive frequency bands.

According to one aspect of an interference protection system, in order to protect a signal from interference, the signal is first split into two signal paths. The signal in the first signal path is delayed. The signal of the second signal path is predistorted using certain processes disclosed herein in order to generate a correction signal in the second signal path. The second signal path uses a phase shifter so that when the correction signal of the second signal path is combined with the delayed signal from the first signal path, the correction signal has the appropriate phase relationship with respect to the delayed signal. The second signal path uses a band-pass filter to eliminate distortion signals outside of a receive frequency band and compensate for any frequency tilt of an output device in the receive frequency band. The combined signal is then output to and amplified by a device, such as a transmit power amplifier. This allows interference produced by the transmit power amplifier to be greatly reduced.

According to one embodiment of the present invention, a receive frequency band interference protection system comprises an input terminal for receiving an input signal and a dividing coupler coupled to the input terminal. The dividing coupler is configured to divide the input signal into a first signal and a second signal. The system further comprises a first signal path and a second signal path. The first signal path comprises a delay, and it is coupled to the dividing coupler and configured to receive the first signal. The second signal path is coupled to the dividing coupler and configured to receive the second signal. The second signal path comprises an attenuator coupled to the dividing coupler and a predistortion linearizer coupled to the attenuator. The system further comprises a combining coupler and an output terminal. The combining coupler is coupled to the first signal path and the second signal path. The combining coupler is configured to obtain a sum of the respective outputs of the first signal path and the second signal path. The output terminal is coupled to the combining coupler and configured to send out the sum.

According to another embodiment of the present invention, a receive frequency band interference protection system comprises an input terminal for receiving an input signal and a dividing coupler coupled to the input terminal. The dividing coupler is configured to divide the input signal into a first signal and a plurality of second signals. The system further comprises a first signal path and a second signal path. The first signal path comprises a delay, and it is coupled to the dividing coupler and configured to receive the first signal. The plurality of second signal paths are coupled to the dividing coupler and configured to receive the plurality of second signals. Each of the plurality of second signal paths comprises an attenuator coupled to the dividing coupler and a predistortion linearizer coupled to the attenuator. The system further comprises a combining coupler and an output terminal. The combining coupler is coupled to the first signal path and each of the plurality of second signal paths. The combining coupler is configured to obtain a sum of the respective outputs of the first signal path and the plurality of second signal paths. The output terminal is coupled to the combining coupler configured to send out the sum.

According to one aspect of the present invention, a method for protecting a receive frequency band from interference comprises the following: receiving an input signal, dividing the input signal into a first signal and a second signal, delaying the first signal, attenuating the second signal, predistorting the attenuated second signal, obtaining a sum of the first signal and the second signal, and outputting the sum.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Additional features and advantages of the invention will be set forth in the description below, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF EXEMPLARY EMBODIMENTS

Figure 1:
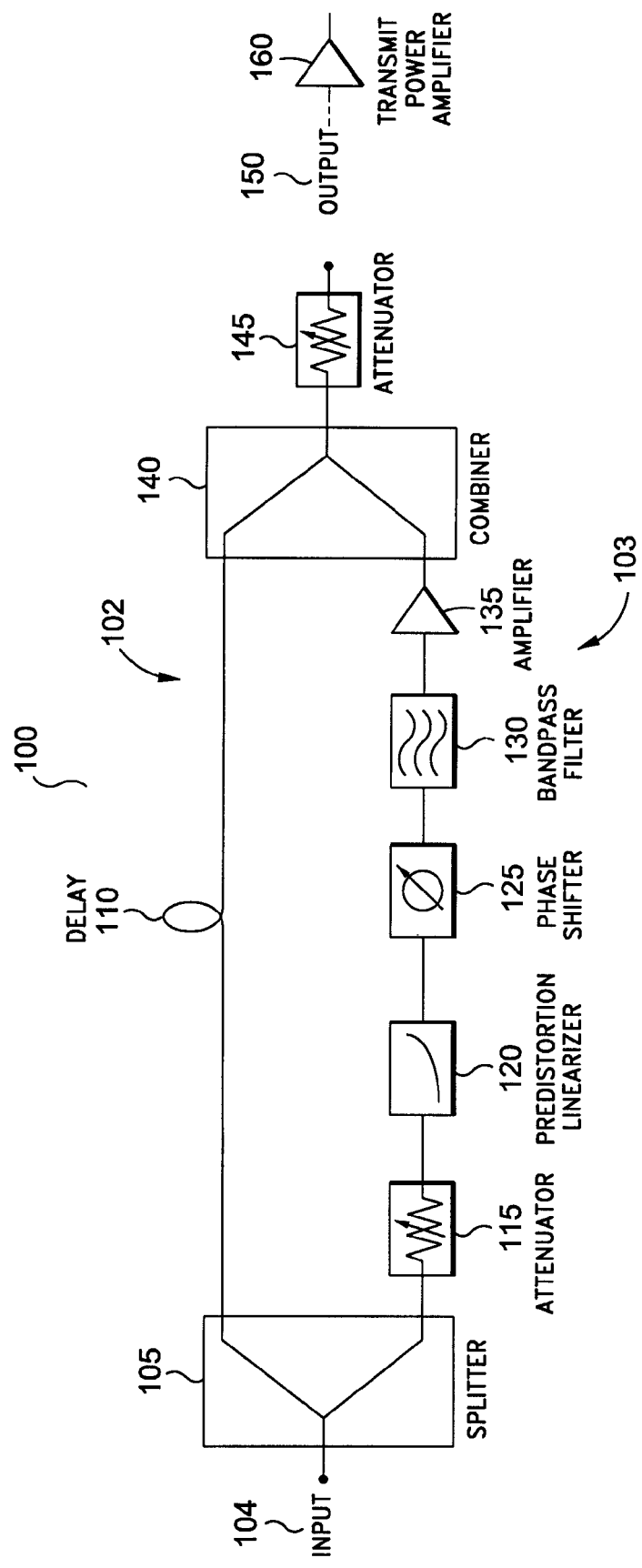
FIG. 1 is a block diagram of an interference protection system according to one embodiment of the present invention.

In the following detailed description, numerous specific details are set forth to provide a full understanding of the present invention. It will be obvious, however, to one ordinarily skilled in the art that the present invention may be practiced without some of these specific details. In other instances, well-known structures and techniques have not been shown in detail so as not to obscure the present invention.

One approach to reducing distortion far from the transmit frequency band is a certain predistortion linearization technique. This technique, however, is generally ineffective. In certain cases, this technique can actually increase the level of distortion far from the transmit frequency band. This poor performance is a result of the inability of such a predistortion system to control the level of higher order distortion products. The shape of the predistortion linearizer's non-linear transfer response cannot be controlled with adequate precision. The higher the order of a distortion product, i.e., the farther away the distortion from the transmit frequency band, generally the greater the precision required of the predistortion linearizer's non-linear transfer response.

Unwanted signals and/or interference in a signal can be generated by a transmit power amplifier. Such interference may be the result of intermodulation distortion generated in a transmit power amplifier in the final stage of a transmit device. Certain predistortion linearization can be effective at reducing intermodulation distortion close to the signal frequency band (primarily $3^{rd}$ and to a lesser degree $5^{th}$ order products), but is generally ineffective at reducing interference in higher order products far away from the signal frequency band. At frequencies outside the signal frequency band, the frequency response of the transmit power amplifier can reject correction signals generated by the predistortion circuitry and can degrade their effectiveness. Correction signals may be rejected because input circuitry of a transmit power amplifier can act as a band-pass filter and attenuate signals outside the signal frequency band. Consequently, even when a predistortion linearizer is adjusted for best correction in and near the signal frequency band, assuming it could generate the exact levels needed for distortion cancellation far from the signal frequency band, such correction signals are attenuated by the transmit power amplifier's input circuitry and thus do not correct signals far from the signal frequency band.

Certain embodiments of the predistortion systems disclosed herein are effective at reducing or otherwise removing interference in such higher order products far away from the signal frequency band. An interference protection system of the present invention can be used to correct for distortion in critical frequency bands far away from the signal frequency band, as well as to correct for distortion in critical frequency bands near the signal frequency band. Such critical frequency bands are often close to the receive frequency band but not directly adjacent to the transmit frequency band. The closer these frequency bands are to the transmit frequency band, the more difficult the task of eliminating interference in these frequency bands by filters. The farther away these frequency bands are in frequency from the transmit frequency band, generally the lower the level of the distortion and the easier to implement a filter solution. The predistortion correction systems disclosed herein can be used by themselves or in conjunction with the filters.

According to one aspect, the present invention can reduce interference in an adjacent channel resulting from non-linearity in a transmit power amplifier and reduce the mass and cost of hardware required for reducing such interference in signal transmitters.

FIG. 1 illustrates a block diagram of an interference protection system 100 according to one embodiment of the present invention. An input signal at an input terminal 104 is divided into two signal paths—a first signal path 102 and a second signal path 103. The signal is divided using a splitter 105. In this illustrated embodiment, the splitter 105 is a 3 dB splitter. In another embodiment, other types of splitters may be used. In an embodiment having more than two signal paths, a splitter with more than two outputs is used. The first signal path 102 is for a transmit frequency band. The second signal path 103 is for a receive frequency band. The signal transmitted through the first signal path 102 remains substantially identical to the original signal input into the splitter 105. The signal transmitted through and modified by the second signal path 103 produces a correction signal for interference in the corresponding receive frequency band.

The first signal path 102 includes a delay 110 and is coupled to a combiner 140. In the second signal path 103, the signal is first applied to a first attenuator 115. The attenuator allows the output level of the correction signal of the second signal path 103 to be adjusted for rejection of interference in the receive frequency band. In this embodiment, a variable or adjustable attenuator 115 is used. In another embodiment, a fixed attenuator can be used. In yet another embodiment, the signal may be first applied to any device for reducing the amplitude or power of a signal without appreciably distorting its waveform. In another embodiment, the degree of attenuation may be continuously adjustable. In yet another embodiment, the degree of attenuation may be incrementally adjustable.

After attenuation 115, the signal of the second signal path 103 is sent to a predistortion linearizer (also known as a "predistorter") 120. The predistortion linearizer 120 is optimized for operation in the receive frequency band. In one embodiment, the predistorter 120 can employ a passive field-effect transistor (FET) predistortion linearizer, although in other embodiments other predistortion generation circuits may also be effective. Exemplary predistortion linearizers are described in U.S. Pat. No. 5,038,113, titled "Nonlinearity Generator Using FET Source-To-Drain Conductance Path," filed Dec. 1, 1989, and in U.S. Pat. No. 5,191,338, titled "Wideband Transmission-Mode FET Linearizer," filed Nov. 29, 1991, both of which are incorporated in their entirety by reference herein.

An output signal of the predistortion linearizer 120 passes through a phase shifter 125, which can shift the phase of the signal. The attenuator 115 and phase shifter 125 allow the correction signal to be precisely set to the level required to optimally cancel the distortion products generated by a transmit power amplifier 160. The phase shifter 125 also allows any differential phase delay between the first signal path 102 and the second signal path 103 introduced by the input circuitry of the transmit power amplifier 160 to be compensated.

The signal on the second signal path 103 is further filtered using a band-pass filter 130. The band-pass filter 130 is tuned for accepting signals within a certain frequency band while suppressing or otherwise rejecting interfering signals outside the selected frequency band (e.g., a receive frequency band). Consequently, the band-pass filter 130 is configured to correspond to the frequency band of the second signal path 103. The pass band response of this filter 130 can be tilted to compensate for the frequency response of an output device (e.g., an amplifier 135) in the receive frequency band. In this embodiment, a band-pass filter 130 in the range of 292 to 320 MHz is used. In another embodiment, a band-pass filter of up to 6 GHz can be used. In yet another embodiment, a band-pass filter of up to 14 GHz can be used. In another embodiment, a combination of a low-pass filter and a high-pass filter can be used. It should be noted that these frequencies are exemplary, and the frequency band of the second signal path 103 is not limited to these ranges.

The correction signal from the band-pass filter 130 drives the amplifier 135. In another embodiment, the correction signal from the band-pass filter 130 can drive other output devices. The amplifier 135 in the interference protection system 100 allows the correction signal to be increased in amplitude to compensate for the attenuation of the band-pass filter 130. The amplifier 135 can be, for example, and without limitation, a bipolar transistor amplifier, a FET amplifier, or a combination thereof. The present invention is not limited to a particular amplifier, and it can use any device that amplifies the strength (or gain) of the signal.

The amplified correction signal of the second signal path 103 is then combined with the signal from the first signal path 102 using the combiner 140. The combiner 140 obtains the sum of the respective outputs of the first signal path 102 and the second signal path 103. In this illustrated embodiment, the combiner 140 is a 3 dB diplexer.

The interference protection system 100 includes the delay 110 and the phase shifter 125 to allow the correction signal from the second signal path 103 to arrive with the desired phase relationship to the signal from the first signal path 102. Thus, the phase shifter 125 allows any differential phase delay between the signal from the first signal path 102 and the correction signal to be compensated. The output of the combiner 140 is then sent to a second attenuator 145. Like the first attenuator 115, the attenuator 145 can be implemented in a number of ways. A transmit power amplifier 160 is coupled to an output terminal 150 of the attenuator 145 and receives the signal from the attenuator 145.

The interference protection system 100 illustrated above can reduce interference in receive frequency bands, and, in particular, in higher order products far away from the signal frequency band. Furthermore, the correction signals generated by the embodiments disclosed herein are not rejected by the transmit power amplifier 160 or substantially degraded in their effectiveness.

The above-described embodiment of FIG. 1 illustrates a circuit with one correction signal path (i.e., the one correction signal path being the second signal path 103). An alternate embodiment of an interference protection system may include multiple signal paths (or N correction signal paths), each representing a receive frequency sub-band, to allow distortion correction in those N correction signal paths. For example, for satellite applications, there can be multiple receive frequency sub-bands used to up-link the signals to be relayed by the satellite and signals for the control and command of the satellite. In an embodiment with N correction signal paths, an N+1-way splitter and an N+1-way combiner are used instead of the 2-way splitter 105 and the 2-way combiner 140. A delay such as the delay 110 is present in the upper most signal path, and the same components such as shown in the second signal path 103 of FIG. 1 can be repeated in each of the N correction signal paths. A band-pass filter in each of the N correction signal paths can be tuned for a respective receive frequency sub-band requiring interference suppression. Consequently, in such an arrangement, the suppression of interference in each receive frequency sub-band can be independently optimized with minimum effect on the other signal paths.

Figure 2:
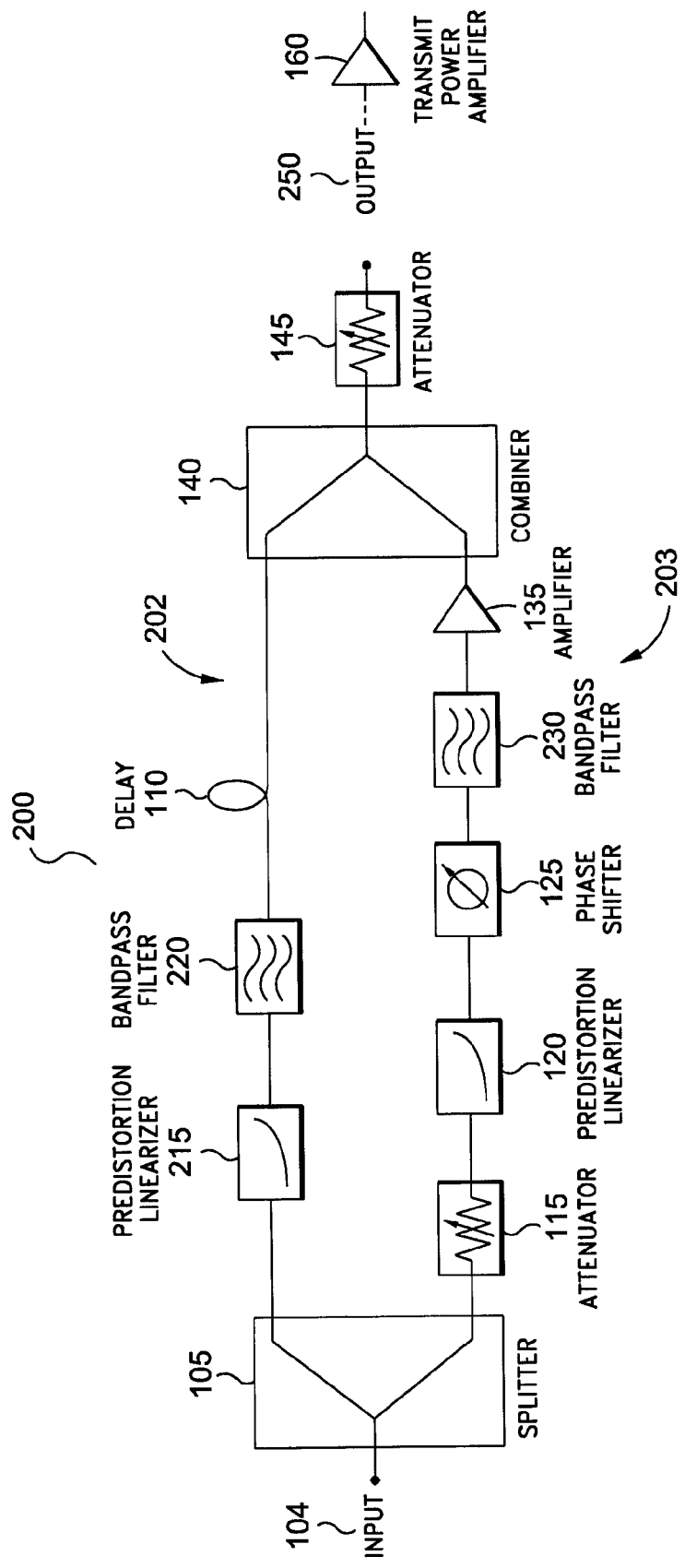
FIG. 2 is a block diagram of an interference protection system including predistortion correction on the first signal path according to another embodiment of the present invention.

According to one embodiment of the present invention, predistortion correction can be added to the first signal path using the configuration shown in FIG. 2. An interference protection system 200 illustrated in FIG. 2 includes a predistortion linearizer 215 and a band-pass filter 220 in the first signal path 202 representing a transmit frequency band. The band-pass filter 220 of the first signal path 202 has a different frequency configuration than that of the band-pass filter 230 of the second signal path 203. For example, the band-pass filter 220 of the first signal path 202 is configured for a range of 360-380 MHz while the band-pass filter 230 of the second signal path 203 is configured for a range of 292-320 MHz. Including predistortion correction in the first signal path 202 of the interference protection system 200 prevents signals of the first signal path 202 from degrading the performance of the correction circuitry of the second signal path 203. The additional circuitry added to the first signal path 202 as illustrated in FIG. 2 can be effective at reducing intermodulation distortion close to the receive frequency band, such as $3^{rd}$ order products. The additional circuitry added to the first signal path 202 may also be effective at reducing intermodulation distortion such as $5^{th}$ order products. The arrangement shown in FIG. 2 may also be generalized for correction in N multiple receive frequency sub-bands, as discussed above.

According to one aspect of the present invention, the configuration illustrated in FIG. 1 provided more than 20 dB of intermodulation distortion suppression in the receive frequency band with a two carrier test signal. One configuration of the embodiment illustrated in FIG. 1 achieved a reduction of receive frequency band interference levels of more than 8 dB with multiple Wideband Code Division Multiple Access (WCDMA) modulated carrier signals.

Figure 3:
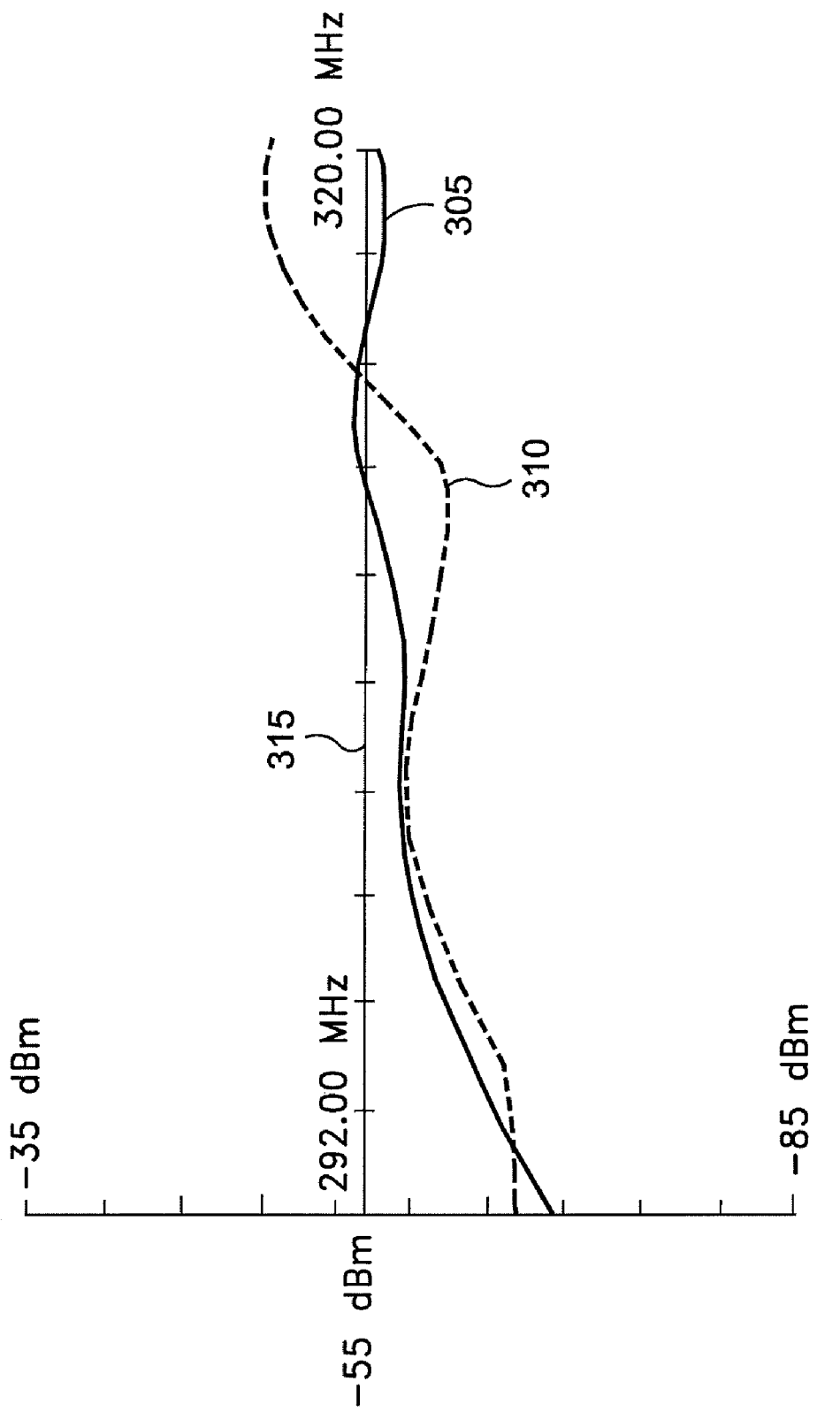
FIG. 3 illustrates the results of a test of an interference protection system with two carrier WCDMA signals according to one aspect of the present invention.

FIG. 3 illustrates results achieved by a breadboard version of the interference protection system 100 of FIG. 1 for two carrier WCDMA signals at approximately 3 dB output back-off (OPBO). The graph illustrates interference in the receive frequency band generated by the transmit power amplifier 160 of the interference protection system 100. The range of detection was between about −35 dBm and about −85 dBm, and the frequency range was between about 292 MHz and about 320 MHz.

The solid line 305 represents the interference in the receive frequency band when the interference protection system 100 was used. The dotted line 310 represents interference in the receive frequency band when the interference protection system 100 was not used. The desired interference level was not to exceed the threshold represented by horizontal line 315. As can be seen, the signal 305 did not exceed the threshold 315 when the interference protection system 100 was used; however, when the interference protection system 100 was not used, the signal 310 crossed over the threshold 315.

Figure 4:
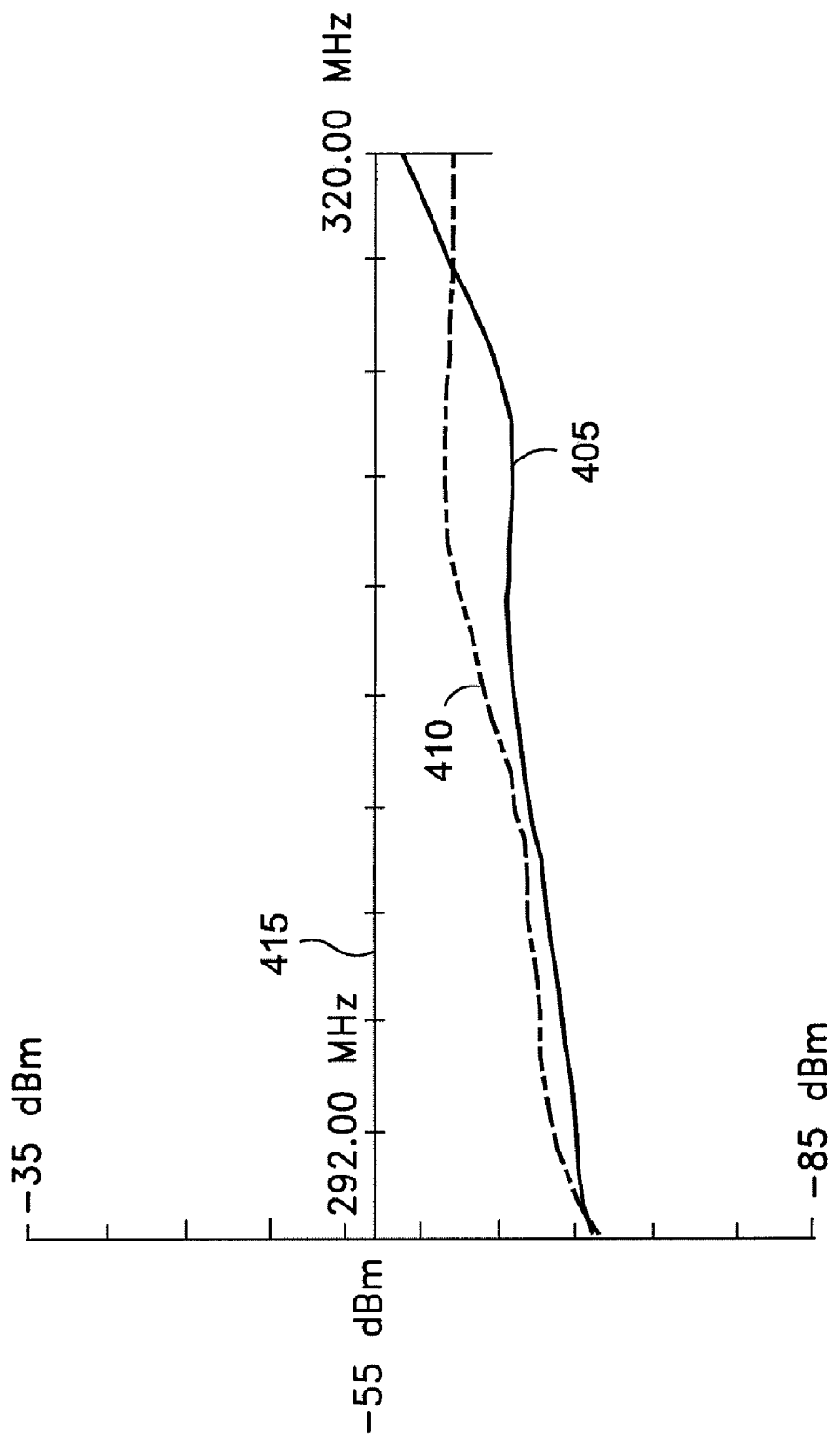
FIG. 4 illustrates the results of a test of an interference protection system with four carrier WCDMA signals according to one aspect of the present invention.

FIG. 4 illustrates results achieved by a breadboard version of the interference protection system 100 of FIG. 1 for four carrier WCDMA signals at approximately 3 dB output back-off. The graph illustrates interference in the receive frequency band generated by the transmit power amplifier 160 of the interference protection system 100. The range of detection was between about −35 dBm and about −85 dBm, and the frequency range was between about 292 MHz and about 320 MHz.

The solid line 405 represents the interference in the receive frequency band when the interference protection system 100 was used. The dotted line 410 represents interference in the receive frequency band when the interference protection system 100 was not used. The desired interference level was not to exceed the threshold represented by horizontal line 415. For the majority of the frequency range, the interference levels when the interference protection system 100 was used were substantially and fairly consistently lower than the levels of interference produced when the interference protection system 100 was not used.

While the interference protection systems 100 and 200 in FIGS. 1 and 2 are described in connection with interference generated by a transmit power amplifier, the present invention is not limited to such configurations, and the present invention can reduce interference generated by other sources. A frequency band pairing can include, for example, a frequency range between 360 MHz and 380 MHz for a transmit frequency band and a frequency range between 292 MHz and 320 MHz for a receive frequency band. In another aspect, a frequency band pairing can include a frequency range between 292 MHz and 320 MHz for a transmit frequency band and a frequency range between 360 MHz and 380 MHz for a receive frequency band. In yet another aspect, a frequency band pairing can include a frequency range between 2.1 GHz and 2.2 GHz for a transmit frequency band and a frequency range between 2.5 GHz and 2.6 GHz for a receive frequency band. These frequency ranges are exemplary, and the present invention is not limited to these ranges.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A receive frequency band interference protection system comprising:
   an input terminal for receiving an input signal for a transmit frequency band;
   a dividing coupler coupled to the input terminal, the dividing coupler configured to divide the input signal into a first signal and a second signal;
   a first signal path comprising:
      a delay;
      a second predistortion linearizer coupled to the dividing coupler;
      a second band-pass filter coupled to the second predistortion linearizer, the second band-pass filter tuned to a transmit frequency band,
      wherein the first signal path is coupled to the dividing coupler and configured to receive the first signal;
   a second signal path coupled to the dividing coupler and configured to receive the second signal, the second signal path comprising:
      an attenuator coupled to the dividing coupler;
      a predistortion linearizer coupled to the attenuator; and
      a band-pass filter configured to receive the output of the predistortion linearizer and filter distortion signals outside of a receive frequency band corresponding to the transmit frequency band;
   a combining coupler coupled to the first signal path and the second signal path, the combining coupler configured to obtain a sum of the respective outputs of the first signal path and the second signal path; and
   an output terminal coupled to the combining coupler and configured to send out the sum.

2. The system of claim 1, wherein the second signal path further comprises:
   a phase shifter coupled to the predistortion linearizer,
   wherein the band-pass filter is coupled to the phase shifter and the band-pass filter is tuned to the receive frequency band.

3. The system of claim 2, wherein the second signal path further comprises an amplifier coupled to the band-pass filter.

4. The system of claim 2, wherein the phase shifter is a variable phase shifter.

5. The system of claim 1, further comprising a second attenuator coupled to the output terminal.

6. The system of claim 1, further comprising a transmit power amplifier coupled to the output terminal.

7. The system of claim 1, wherein the attenuator is a variable attenuator.

8. The system of claim 1, wherein the attenuator is a fixed attenuator.

9. A receive frequency band interference protection system comprising:
   an input terminal for receiving an input signal for a transmit frequency band;
   a dividing coupler coupled to the input terminal, the dividing coupler configured to divide the input signal into a first signal and a plurality of second signals;
   a first signal path comprising:
      a delay;
      a second predistortion linearizer coupled to the dividing coupler; and
      a second band-pass filter coupled to the second predistortion linearizer, the second band-pass filter tuned to a transmit frequency band;

wherein the first signal path is coupled to the dividing coupler and configured to receive the first signal;

a plurality of second signal paths configured to receive the plurality of second signals, each of the plurality of second signal paths comprising:
  an attenuator coupled to the dividing coupler;
  a predistortion linearizer coupled to the attenuator; and
  a band-pass filter configured to receive the output of the predistortion linearizer and filter distortion signals outside of a receive frequency band corresponding to the transmit frequency band;

a combining coupler coupled to the first signal path and each of the plurality of second signal paths, the combining coupler configured to obtain a sum of the respective outputs of the first signal path and the plurality of second signal paths; and an output terminal coupled to the combining coupler configured to send out the sum.

10. The system of claim 9, wherein each of the plurality of second signal paths further comprise:
  a phase shifter coupled to the predistortion linearizer,
  wherein the band-pass filter is coupled to the phase shifter and the band-pass filter is tuned to the receive frequency band.

11. The system of claim 9, further comprising a second attenuator coupled to the output terminal.

12. The system of claim 9, further comprising a transmit power amplifier coupled to the output terminal.

13. A method for protecting a receive frequency band from interference, the method comprising:
  receiving an input signal for a transmit frequency band;
  dividing the input signal into a first signal and a second signal;
  predistorting the first signal;
  filtering the predistorted first signal;
  delaying the filtered first signal;
  attenuating the second signal;
  predistorting the attenuated second signal;
  filtering the predistorted second signal;
  obtaining a sum of the delayed first signal and the filtered second signal; and
  outputting the sum,
  wherein the filtering comprises filtering distortion signals outside of a receive frequency band corresponding to the transmit frequency band.

14. The method of claim 13, further comprising:
  phase shifting the predistorted second signal,
  wherein the filtering the predistorted second signal comprises filtering the phase shifted second signal.

15. The method of claim 14, further comprising amplifying the filtered second signal.

16. The method of claim 13, further comprising attenuating the sum.

17. The method of claim 13, further comprising amplifying the sum.

* * * * *